US012757635B2

(12) United States Patent
Yamashita et al.

(10) Patent No.: US 12,757,635 B2
(45) Date of Patent: Oct. 6, 2026

(54) ULTRASONIC MOTOR HAVING A PLATE-SHAPED VIBRATING BODY

(71) Applicant: Murata Manufacturing Co., Ltd., Nagaokakyo (JP)

(72) Inventors: Toshiaki Yamashita, Nagaokakyo (JP); Tsuguji Kambayashi, Nagaokakyo (JP); Hideaki Kashiura, Nagaokakyo (JP); Hiroshi Asano, Nagaokakyo (JP)

(73) Assignee: MURATA MANUFACTURING CO., LTD., Nagaokakyo (JP)

( * ) Notice: Subject to any disclaimer, the term of this patent is extended or adjusted under 35 U.S.C. 154(b) by 757 days.

(21) Appl. No.: 18/194,775

(22) Filed: Apr. 3, 2023

(65) Prior Publication Data

US 2023/0240144 A1 Jul. 27, 2023

Related U.S. Application Data

(63) Continuation of application No. PCT/JP2021/041397, filed on Nov. 10, 2021.

(30) Foreign Application Priority Data

Nov. 13, 2020 (JP) ................................ 2020-189590

(51) Int. Cl.
*H10N 30/20* (2023.01)
*B06B 1/06* (2006.01)
*H10N 30/87* (2023.01)

(52) U.S. Cl.
CPC ............... *H10N 30/20* (2023.02); *B06B 1/06* (2013.01); *H10N 30/87* (2023.02)

(58) Field of Classification Search
CPC ........... H10N 30/20; H10N 30/87; B06B 1/06
See application file for complete search history.

(56) References Cited

U.S. PATENT DOCUMENTS

| | | | |
|---|---|---|---|
| 4,829,209 | A | 5/1989 | Kawasaki et al. |
| 5,172,023 | A | 12/1992 | Kawai et al. |
| 2011/0215675 | A1 | 9/2011 | Asano |

FOREIGN PATENT DOCUMENTS

| | | | |
|---|---|---|---|
| JP | S61106076 | A | 5/1986 |
| JP | S62193573 | A | 8/1987 |

(Continued)

OTHER PUBLICATIONS

International Search Report in PCT/JP2021/041397, mailed Jan. 25, 2022, 3 pages.

*Primary Examiner* — Emily P Pham
*Assistant Examiner* — Monica Mata
(74) *Attorney, Agent, or Firm* — ArentFox Schiff LLP

(57) ABSTRACT

An ultrasonic motor is provided with increased torque without an increase in size. The ultrasonic motor includes a stator having a plate-shaped vibrating body including first and second main surfaces and a piezoelectric element on the first main surface; and a rotor in contact with the second main surface. The piezoelectric element is disposed along a circumferential direction of a traveling wave so as to generate the traveling wave circulating around an axial direction Z by vibrating the vibrating body. The piezoelectric element vibrates the vibrating body in a vibration mode including a nodal line extending in the circumferential direction. A mass addition portion is provided along the circumferential direction on at least one of the first and second main surfaces of the vibrating body 3, and the mass addition portion is located outside the nodal line in a direction perpendicular to the axial direction Z.

20 Claims, 5 Drawing Sheets

(56) References Cited

FOREIGN PATENT DOCUMENTS

| | | | |
|---|---|---|---|
| JP | H01214274 | A | 8/1989 |
| JP | H02110992 | U1 | 9/1990 |
| WO | 2010061508 | A1 | 6/2010 |

STANDING WAVE X

STANDING WAVE Y

TRAVELING WAVE

ULTRASONIC MOTOR HAVING A PLATE-SHAPED VIBRATING BODY

CROSS REFERENCE TO RELATED APPLICATIONS

This application is a continuation of PCT Application No. PCT/JP2021/041397, filed Nov. 10, 2021, which claims priority to Japanese Patent Application No. 2020-189590, filed Nov. 13, 2020, the entire contents of each of which are hereby incorporated by reference in their entirety.

TECHNICAL FIELD

The present invention relates to an ultrasonic motor.

BACKGROUND

Conventionally, there have been proposed various ultrasonic motors in each of which a stator is vibrated by a piezoelectric element. Japanese Patent Application Laid-Open No. S61-106076 (hereinafter "Patent Document 1") discloses an example of a piezoelectric motor. In this piezoelectric motor, a slider is rotated by vibration of a fixed element being transmitted to the slider. Moreover, a protrusion for transmitting vibration is provided only on a portion of the fixed element that is in contact with the slider.

Conventionally, in order to increase a torque of a motor, it is necessary to increase the size of the fixed element, in other words, the size of the stator needs to be increased. Therefore, it is necessary to make the whole motor larger. In recent years, downsizing of a device has progressed, but it has been difficult to achieve both of increasing the torque of a motor and contribution to downsizing of the device.

SUMMARY OF THE INVENTION

Accordingly, it is an object of the present invention to provide an ultrasonic motor with increased torque without increase in size.

In an exemplary aspect, an ultrasonic motor is provided that includes a stator having a plate-shaped vibrating body including a first main surface and a second main surface that face each other; a piezoelectric element provided on the first main surface of the vibrating body; and a rotor in direct or indirect contact with the second main surface of the vibrating body. Moreover, in accordance with an axial direction that connects the first main surface and the second main surface of the vibrating body and is along a rotation center, the piezoelectric element is disposed along a circumferential direction of a traveling wave. The piezoelectric element vibrates the vibrating body to generate the traveling wave circulating around the axial direction, the piezoelectric element vibrates the vibrating body in a vibration mode including a nodal line extending in the circumferential direction, and a mass addition portion is disposed along the circumferential direction on at least one of the first main surface and the second main surface of the vibrating body, and is located outside the nodal line in a direction perpendicular to the axial direction.

The ultrasonic motor of the present invention provides for increased torque compared with conventional motors without an increase in size.

DETAILED DESCRIPTION

Hereinafter, the present invention will be clarified by describing specific embodiments of the present invention with reference to the drawings.

Note that each of the embodiments described in the present specification is an exemplary embodiment, and replacement of some part or combination of configurations is possible between different embodiments as would be appreciated to one skilled in the art.

Figure 1:
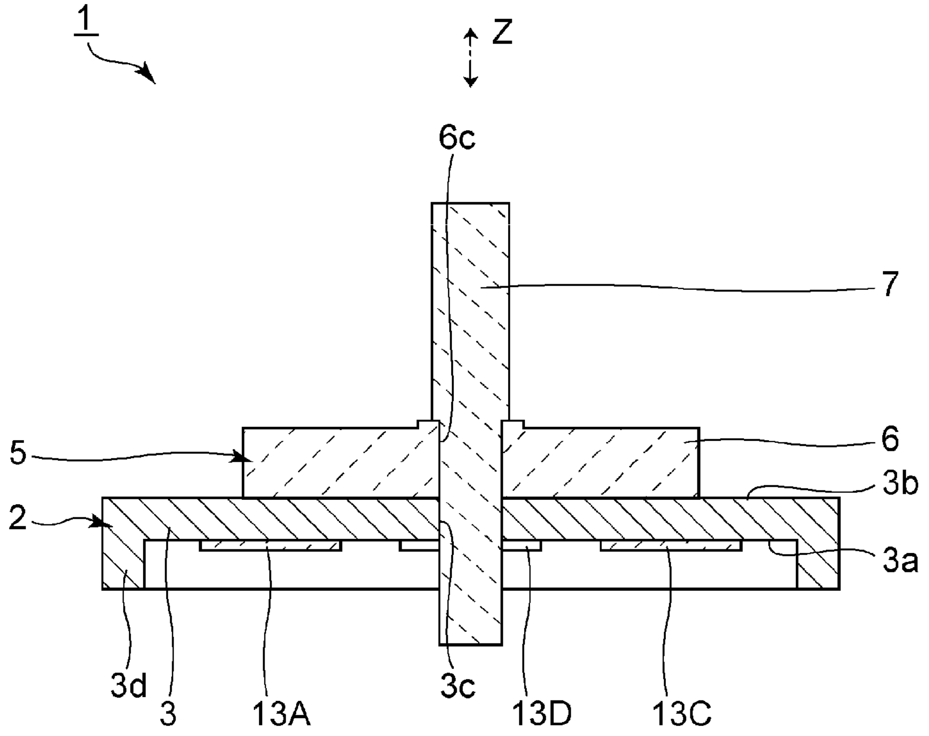
FIG. 1 is a front sectional view of an ultrasonic motor according to a first exemplary embodiment.

FIG. 1 is a front sectional view of an ultrasonic motor according to a first exemplary embodiment.

As shown, an ultrasonic motor 1 is provided includes a stator 2 and a rotor 5. The stator 2 and the rotor 5 are in contact with each other. A traveling wave generated in the stator 2 rotates the rotor 5. Hereinafter, a specific configuration of the ultrasonic motor 1 will be described.

The stator 2 includes a vibrating body 3 that has a disk shape in the exemplary aspect. The vibrating body 3 has a first main surface 3*a* and a second main surface 3*b*. The first main surface 3*a* and the second main surface 3*b* face each other (e.g., are opposing surfaces of the vibrating body). In the present exemplary aspect, an axial direction Z is a direction that connects the first main surface 3*a* and the second main surface 3*b*, and is a direction along a rotation center, for example, in the vertical direction of FIG. 1. A through-hole 3*c* is provided in a central part of the vibrating body 3. However, the position of the through-hole 3*c* is not limited to the above. The through-hole 3*c* only needs to be located in a region including an axial direction center. In addition, the shape of the vibrating body 3 is not limited to a disk shape. For example, the shape of the vibrating body 3 viewed from the axial direction Z may be a regular polygon such as a regular hexagon, a regular octagon, or a regular decagon, according to exemplary aspects. The vibrating body 3 includes appropriate metal, but it is not necessarily made of metal. The vibrating body 3 may be configured with another elastic body such as ceramic, silicon material, or synthetic resin in alternative exemplary aspects.

The rotor 5 has a rotor body 6 and a rotation shaft 7. The rotor body 6 has a through-hole 6*c* that is located at the center of the rotor body 6. The rotation shaft 7 is inserted in the through-hole 6*c*. However, the position of the through-hole 6*c* is not limited to the above. The through-hole 6*c* only needs to be located in a region including the axial direction center. The rotation shaft 7 is also inserted in the through-hole 3*c* of the vibrating body 3. The through-hole 3*c* of the vibrating body 3 and the through-hole 6*c* of the rotor body 6 do not need to be provided. In this case, for example, one end of the rotation shaft 7 may be connected to the rotor body 6. Furthermore, the shape of the rotor body 6 is not limited to the above described configuration. For example, the shape of the rotor body 6 viewed from the axial direction Z may be a regular polygon such as a regular hexagon, a regular octagon, or a regular decagon in alternative aspects.

In the present specification, a direction viewed from the axial direction Z is referred to as plan view or bottom view in some cases. Note that plan view is a direction viewed from above in FIG. 1, and bottom view is a direction viewed from below. Here, in the present embodiment, the vibrating body 3 has a disk shape. Therefore, in the following description, a direction perpendicular to the axial direction Z may be written as a radial direction.

Figure 2:
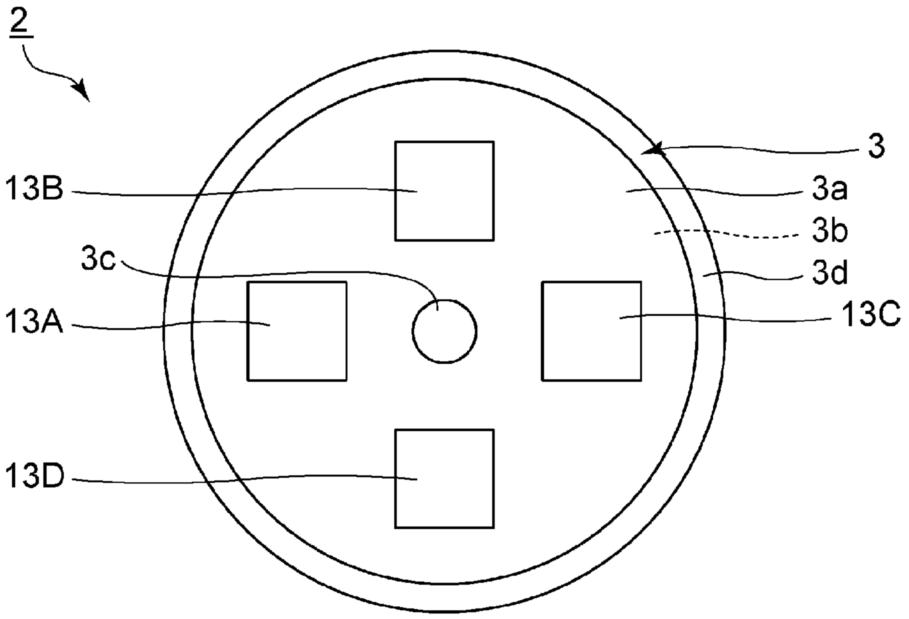
FIG. 2 is a bottom view of a stator in the first exemplary embodiment.

FIG. 2 is a bottom view of the stator in the first embodiment.

As illustrated in FIG. 2, a plurality of piezoelectric elements are provided on the first main surface 3*a* of the vibrating body 3. The plurality of piezoelectric elements are dispersedly disposed along a circumferential direction of a traveling wave so as to generate the traveling wave circulating around an axis parallel to the axial direction Z. When viewed from the axial direction Z, the first piezoelectric element 13A and the third piezoelectric element 13C face each other with the axis interposed therebetween. The second piezoelectric element 13B and the fourth piezoelectric element 13D face each other with the axis interposed therebetween. In operation, the plurality of piezoelectric elements are configured to vibrate the vibrating body 3 in a vibration mode including a nodal line extending in the circumferential direction.

Figure 3:
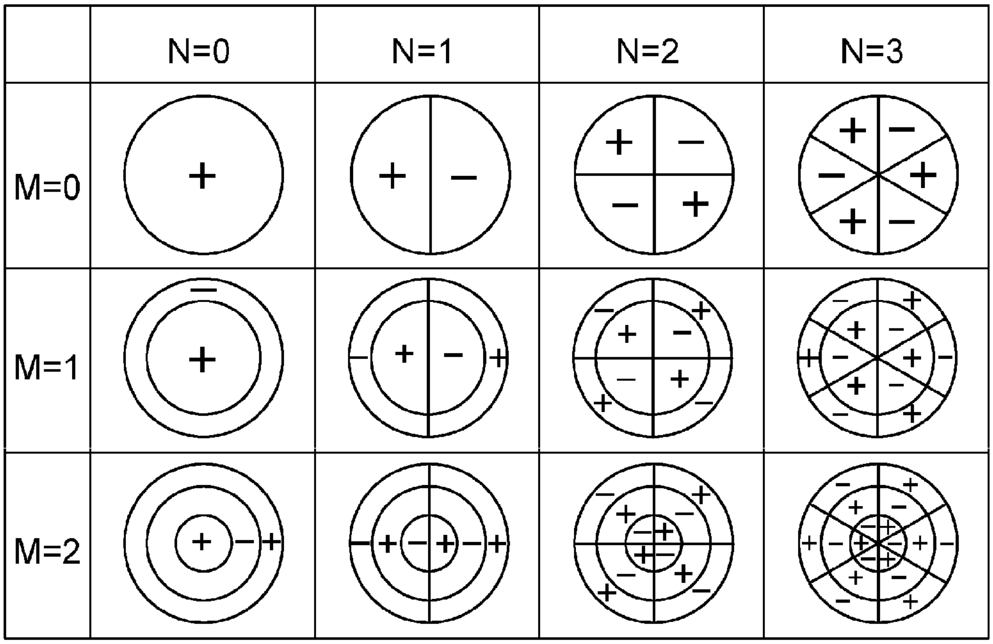
FIG. 3 is a schematic diagram for explaining each vibration mode.

FIG. 3 is a schematic diagram for explaining each vibration mode. Specifically, FIG. 3 illustrates a phase of vibration in each region of the vibrating body 3 in a plan view. It is shown that the regions denoted by the sign "+" and the regions denoted by the sign "−" have phases of vibration opposite to each other.

When the number of the nodal lines extending in the circumferential direction is assumed to be M and the number of the nodal lines extending in the radial direction is assumed to be N, the vibration mode can be represented by an (M, N) mode. In the present embodiment, a (1, 3) mode is used. However, the vibration mode is not limited to the (1, 3) mode. M only needs to be a natural number, and N only needs to be an integer greater than or equal to 0.

As illustrated in FIGS. 1 and 2, a mass addition portion 3*d* is provided on the first main surface 3*a* of the vibrating body 3. More specifically, the mass addition portion 3*d* is an annular protrusion in the exemplary aspect. The mass addition portion 3*d* is formed by bending the vicinity of the outer peripheral edge of a plate-shaped member forming the vibrating body 3. Therefore, the mass addition portion 3*d* is located in a portion including the outer peripheral edge of the vibrating body 3. In the radial direction, the mass addition portion 3*d* is located outside the nodal line. In the portion where the mass addition portion 3*d* is disposed, the thickness of the vibrating body 3 is thicker, and the mass is larger. Note that the mass addition portion 3*d* only needs to be provided on at least one of the first main surface 3*a* and the second main surface 3*b* of the vibrating body 3. Here, in the present specification, the outer peripheral edge is the outer peripheral edge in a plan view or bottom view. The thickness is a dimension along the axial direction Z.

According to the present embodiment, the mass addition portion 3*d* is provided on the first main surface 3*a* of the vibrating body 3 along the circumferential direction, and the mass addition portion 3*d* is located outside the nodal line in a direction perpendicular to the axial direction Z. This configuration increases the torque without increasing the size of the ultrasonic motor 1. Details of this arrangement will be described below together with a configuration of the piezoelectric elements and a driving method of the ultrasonic motor of the present embodiment.

Figure 4:
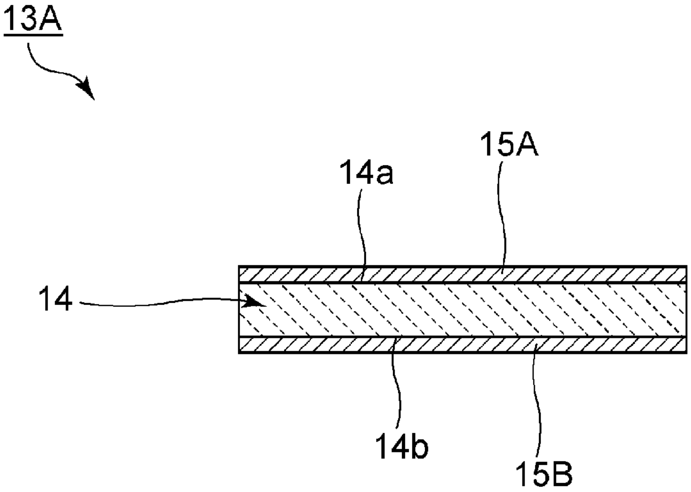
FIG. 4 is a front sectional view of a first piezoelectric element in the first exemplary embodiment.

FIG. 4 is a front sectional view of the first piezoelectric element in the first embodiment.

The first piezoelectric element 13A has a piezoelectric body 14. The piezoelectric body 14 has a third main surface 14*a* and a fourth main surface 14*b*. The third main surface 14*a* and the fourth main surface 14*b* face each other. Moreover, the first piezoelectric element 13A has a first electrode 15A and a second electrode 15B. As shown, the first electrode 15A is provided on the third main surface 14*a* of the piezoelectric body 14, and the second electrode 15B is provided on the fourth main surface 14*b* of the piezoelectric body 14. The second piezoelectric element 13B, the third piezoelectric element 13C, and the fourth piezoelectric element 13D are also configured similarly to the first piezoelectric element 13A. Each of the above piezoelectric elements has a rectangular shape in a plan view. It should be appreciated that the shape of each piezoelectric element in a plan view is not limited to the above, and may be, for example, an elliptical shape.

Here, the first electrode 15A is attached to the first main surface 3*a* of the vibrating body 3 with an adhesive. The thickness of the adhesive is very thin. Therefore, the first electrode 15A is electrically connected to the vibrating body 3.

In order to generate a traveling wave, the stator 2 only needs to include at least the first piezoelectric element 13A and the second piezoelectric element 13B. Alternatively, one piezoelectric element divided into a plurality of regions may be included. In this case, for example, each region of the piezoelectric element may be polarized in different directions.

In the stator 2, a structure in which a plurality of piezoelectric elements are dispersedly disposed in the circumferential direction and driven to generate a traveling wave is disclosed in WO 2010/061508 A1, for example. Not only the structure for generating a traveling wave is described in the following description, but also the configuration described in WO 2010/061508 A1 is incorporated by reference into the present specification, and the detailed description is omitted.

Figure 5A:
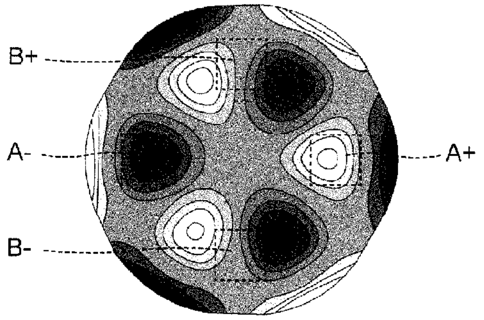
FIGS. 5(*a*) to 5(*c*) are schematic bottom views of the stator each for explaining a traveling wave excited in the first embodiment.
Figure 5B:
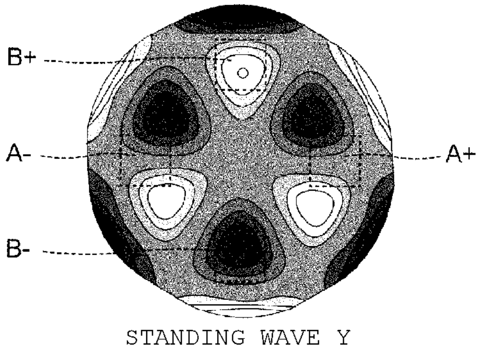
Figure 5C:
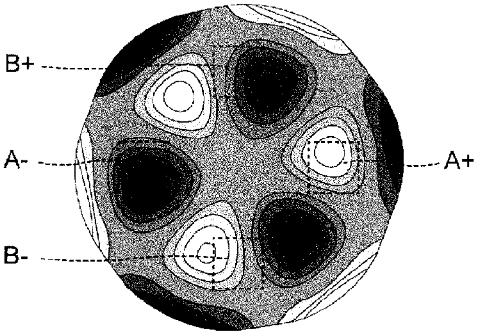
Figure 6:
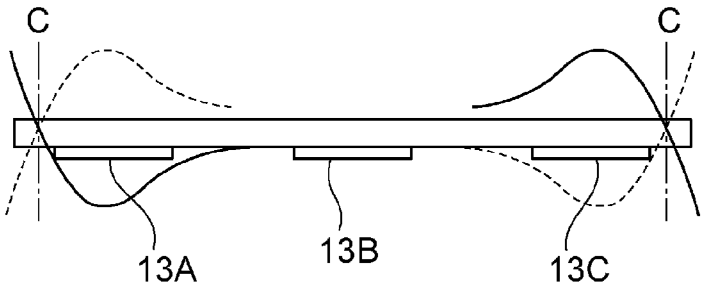
FIG. 6 is a schematic front view of a stator for explaining a traveling wave in a case where a mass addition portion is not provided on the stator.

FIGS. 5(*a*) to 5(*c*) are schematic bottom views of the stator for explaining the traveling wave excited in the first embodiment. FIG. 6 is a schematic front view of the stator for explaining the traveling wave in a case where the mass addition portion is not provided on the stator. FIGS. 5(*a*) to 5(*c*) show that, in a gray scale, the closer to black, the stronger the stress in one direction, and the closer to white, the stronger the stress in the other direction. The solid lines and the broken lines in FIG. 6 schematically show the magnitude of the vibration energy.

FIG. 5(*a*) shows three standing waves X, and FIG. 5 (*b*) shows three standing waves Y. It is assumed that the first to fourth piezoelectric elements 13A to 13D are arranged with a central angle of 30° therebetween. Moreover, it is assumed that each piezoelectric element has a circumferential dimension occupying a central angle of 60°. In this case, since the three standing waves X and Y are excited, the central angle corresponding to the wavelength of the traveling wave is 120°. That is, the first to fourth piezoelectric elements 13A to 13D each have a circumferential dimension corresponding to the central angle of 120°/2=60°. Neighboring piezoelectric elements are separated at an interval corresponding to a central angle of 120°/4=30°. In this case, as described above, the three standing waves X and Y having phases different from each other by 90° are excited, and the standing waves X and Y are combined to generate the traveling wave illustrated in FIG. 5(*c*).

In FIGS. 5(*a*) to 5(*c*), "A+", "A−", "B+", and "B−" represent polarization directions of the piezoelectric body 14. In addition, "+" means that polarization is established from the third main surface 14*a* toward the fourth main surface 14*b* in the thickness direction, "−" means that polarization is established in the opposite direction. Moreover, "A" denotes the first piezoelectric element 13A and the third piezoelectric element 13C, and "B" denotes the second piezoelectric element 13B and the fourth piezoelectric element 13D.

Note that, although an example of three waves has been described, the present invention is not limited thereto, and also in the case of six waves, nine waves, twelve waves, or the like, two standing waves having a phase difference of 90° are similarly excited, whereby a traveling wave is generated by combination of the two standing waves.

It is also noted that in the present invention, the configuration for generating a traveling wave is not limited to the configuration illustrated in FIGS. 5(*a*) to 5(*c*), and it is possible to use conventionally known various configurations for generating a traveling wave.

As illustrated in FIG. 6, when the traveling wave is excited, the parts denoted by dashed-dotted lines C correspond to the nodal line. The vibration energy is larger radially outside the nodal line. In addition, in the present embodiment illustrated in FIG. 1, the mass addition portion 3*d* is located radially outside the nodal line. Therefore, the mass is larger radially outside the nodal line. In a portion having a larger mass, the energy of vibration is larger. Therefore, the energy density in the stator 2 is effectively increased. As a result, the torque is also increased.

In general, the torque depends on the radius of the motor. In the case of the ultrasonic motor 1, the radius corresponds to the radius of a circle connecting points of action of the stator 2. More specifically, the points of action are portions that are in contact with the rotor 5 and rotate the rotor 5. In the present embodiment, the balance point of mass in the radial direction is closer to the outer side in the radial direction as compared with the case where the mass addition portion 3*d* is not provided. As a result, the points of action shift radially outward as compared with the case where the mass addition portion 3*d* is not provided. Therefore, the radius can be increased, and the torque of the ultrasonic motor 1 can be effectively increased. As described above, the torque can be increased without increasing the size of the ultrasonic motor 1.

As described above, in the present embodiment, the (M, N) mode is used. More specifically, M=1 and N=3. In the case where M is 2 or greater, there are generated a plurality of nodal lines extending in the circumferential direction. In this case, it is preferable that the mass addition portion 3*d* be located on the outside of the outermost nodal line in the radial direction. This arrangement makes it possible to dispose the points of action more reliably on the radially outer side, and the torque can be more reliably increased.

Hereinafter, there will be described first to third variations of the first embodiment in which only the disposition of the mass addition portion is different from the first embodiment. Also in the first to third variations, similarly to the first embodiment, the torque can be effectively increased without increasing the size of the ultrasonic motor.

Figure 7:
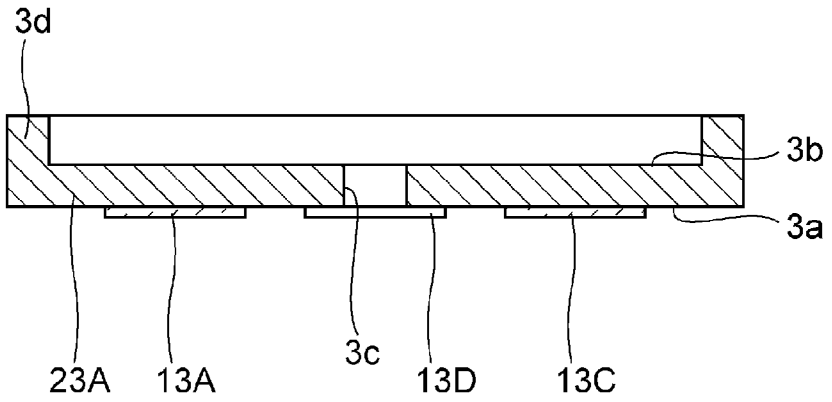
FIG. 7 is a front sectional view of a stator in a first variation of the first exemplary embodiment.

In the first variation illustrated in FIG. 7, a mass addition portion 3*d* is provided on a second main surface 3*b* of a vibrating body 23A. It is noted that the mass addition portion 3*d* is not provided on a first main surface 3*a*.

Figure 8:
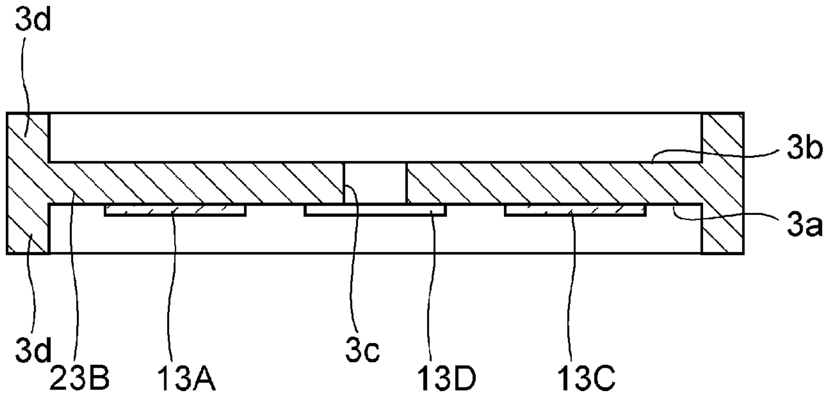
FIG. 8 is a front sectional view of a stator in a second variation of the first exemplary embodiment.

In the second variation illustrated in FIG. 8, a mass addition portion 3*d* is provided on both a first main surface 3*a* and a second main surface 3*b* of a vibrating body 23B.

However, as in the first embodiment illustrated in FIG. 1, the mass addition portion 3*d* is preferably provided only on the first main surface 3*a* of the vibrating body 3. That arrangement enables the mass addition portion 3*d* to be easily configured by press working. As a result, productivity can be improved. Practically, flatness can be impaired in the surface subjected to the press working. Here, since the first main surface 3*a* is a surface on which a plurality of piezoelectric elements are provided, the first main surface 3*a* preferably has high flatness. In the case of the first embodiment, since the press working is performed from the second main surface 3*b* side, it is more reliable that the flatness of the first main surface 3*a* is less likely to be impaired. Therefore, productivity can be effectively improved.

In addition, as illustrated in FIG. 1, the mass addition portion 3*d* is disposed on a surface not in contact with the rotor 5. Therefore, the position at which the mass addition portion 3*d* is located is not limited by the size of the rotor 5, and there is no need to increase the size of the vibrating body 3. As a result, downsizing of the ultrasonic motor 1 is less likely to be hindered.

Note that the mass addition portion 3*d* of the first variation can be provided by press working, for example. The mass addition portion 3*d* of the second variation can be provided by cutting work, for example.

Figure 9:
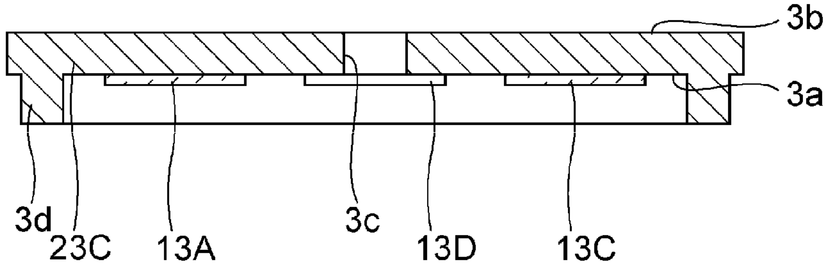
FIG. 9 is a front sectional view of a stator in a third variation of the first exemplary embodiment.

In the third variation illustrated in FIG. 9, a mass addition portion 3*d* is provided at a position not including the outer peripheral edge on a first main surface 3*a* of a vibrating body 23C. It is also noted that the mass addition portion 3*d* is disposed radially outside the nodal line. The mass addition portion 3*d* of the third variation can be provided by cutting work, for example. However, as in the first embodiment, the mass addition portion 3*d* is preferably disposed to include the outer peripheral edge. In this case, the mass addition portion 3*d* can be easily provided by press working.

Figure 10:
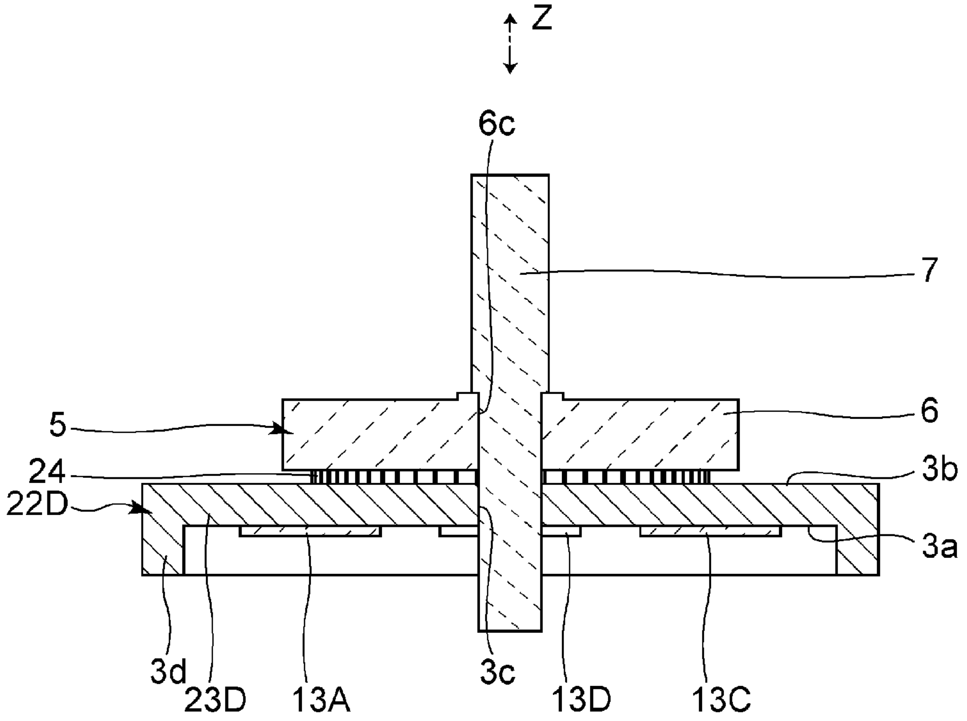
FIG. 10 is a front sectional view of an ultrasonic motor according to a fourth variation of the first exemplary embodiment.

FIG. 10 is a front sectional view of an ultrasonic motor according to the fourth variation of the first embodiment.

The present variation is different from the first embodiment in that a plurality of protrusions 24 are provided on a second main surface 3*b* of a vibrating body 23D. The protrusions 24 protrude in the axial direction Z from a second main surface 3*b*. The plurality of protrusions 24 are disposed along the circumferential direction of the traveling wave. In the present modification, the plurality of protrusions 24 are arranged in an annular shape as viewed from the axial direction Z. The plurality of protrusions 24 are located radially inside the nodal line when the traveling wave is excited. A stator 22D is in contact with a rotor 5 at the plurality of protrusions 24.

As described above, the protrusions 24 of the stator 22D protrude in the axial direction Z from the second main surface 3*b* of the vibrating body 23D. Therefore, when a traveling wave is generated in the vibrating body 23D, the tips of the protrusions 24 are displaced more greatly. As a result, the rotor 5 can be efficiently rotated by the traveling wave generated in the stator 22D.

In the first embodiment illustrated in FIG. 1, the rotor 5 is in direct contact with the second main surface 3*b* of the vibrating body 3. However, a friction member may be attached to the rotor body 6. That is, the rotor 5 may be in indirect contact with the second main surface 3*b* of the vibrating body 3 with the friction member interposed therebetween. In this case, a frictional force between the rotor 5 and the vibrating body 3 is increased. As a result, the rotor 5 can be efficiently rotated by the traveling wave.

In the ultrasonic motor 1, the material of the mass addition portion 3*d* is the same as the material of the vibrating body 3, and the mass addition portion 3*d* is integrated with the vibrating body 3. However, the mass addition portion 3*d* may be a separate body from the vibrating body 3. This example will be described in a second embodiment below.

Figure 11:
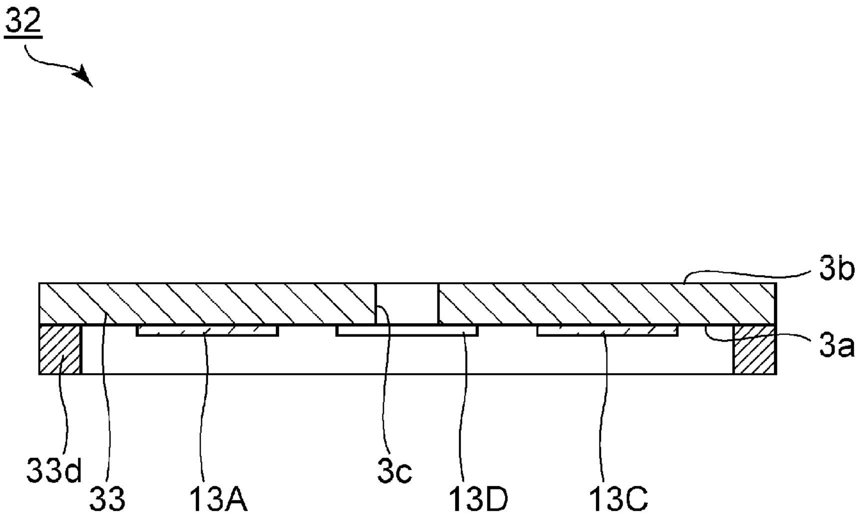
FIG. 11 is a front sectional view of a stator in a second exemplary embodiment.

FIG. 11 is a front sectional view of a stator in the second embodiment.

The present embodiment is different from the first embodiment in that a mass addition portion 33*d* is not integrated with a vibrating body 33. Instead, the material of the mass addition portion 33*d* is different from the material of the vibrating body 33. However, other than the above points, the ultrasonic motor of the present embodiment is configured similarly to the ultrasonic motor 1 of the first embodiment.

Moreover, the mass addition portion 33*d* has an annular shape. The mass addition portion 33*d* includes, for example, a metal different from the material used for the vibrating body 33, ceramics, or the like. The mass addition portion 33*d* may be bonded to the vibrating body 33 with, for example, adhesive, solder, or the like.

Also in the present embodiment, similarly to the first embodiment, the mass addition portion 33*d* is located radially outside the nodal line. As a result, the energy density of vibration in the stator 32 can be effectively increased. In addition, the radius of the circle connecting the points of action of the stator 32 can be increased without increasing the size of the vibrating body 33. As a result, the torque can be increased without increasing the size of the ultrasonic motor.

The density of the material of the mass addition portion 33*d* is preferably larger than the density of the material of the vibrating body 33. With that arrangement, also in the case where the volume of the mass addition portion 33*d* is small, the mass can be effectively increased on the radially outside the nodal line. As a result, downsizing of the ultrasonic motor is less likely hindered.

In general, it is noted that throughout this description, the embodiments and examples shown should be considered as exemplars, rather than limitations on the apparatus and procedures disclosed or claimed. Although many of the examples presented herein involve specific combinations of method acts or system elements, it should be understood that those acts and those elements may be combined in other ways to accomplish the same objectives. Elements and features discussed only in connection with one embodiment are not intended to be excluded from a similar role in other embodiments.

DESCRIPTION OF REFERENCE SYMBOLS

1: Ultrasonic motor
2: Stator
3: Vibrating body
3*a*, 3*b*: First and second main surfaces
3*c*: Through-hole
3*d*: Mass addition portion
5: Rotor
6: Rotor body
6*c*: Through-hole
7: Rotation shaft
13A to 13D: First to fourth piezoelectric elements
14: Piezoelectric body
14*a*, 14*b*: Third and fourth main surfaces
15A, 15B: First and second electrodes
22D: Stator
23A to 23D: Vibrating body
24: Protrusion
32: Stator
33: Vibrating body
33*d*: Mass addition portion

The invention claimed is:

1. An ultrasonic motor comprising:

a stator that includes a plate-shaped vibrating body including a first main surface and a second main surface that oppose each other;

a piezoelectric element on the first main surface of the plate-shaped vibrating body;

a mass addition portion; and a rotor in direct or indirect contact with the second main surface of the plate-shaped vibrating body, wherein the piezoelectric element is disposed along a circumferential direction of a traveling wave and is configured to vibrate the plate-shaped vibrating body to generate the traveling wave circulating around an axial direction, wherein the piezoelectric element is configured to vibrate the plate-shaped vibrating body in a vibration mode including a nodal line that extends in the circumferential direction, and wherein the mass addition portion is disposed along the circumferential direction on at least one of the first main surface and the second main surface of the plate-shaped vibrating body, and is located outside the nodal line in a direction perpendicular to the axial direction.

2. The ultrasonic motor according to claim 1, wherein the axial direction is a direction that connects the first main surface to the second main surface and is along a rotation center.

3. The ultrasonic motor according to claim 1, wherein the mass addition portion includes a same material as a material of the plate-shaped vibrating body.

4. The ultrasonic motor according to claim 1, wherein the mass addition portion is integrated with the plate-shaped vibrating body.

5. The ultrasonic motor according to claim 1, wherein the mass addition portion includes a material different from a material of the plate-shaped vibrating body.

6. The ultrasonic motor according to claim 1, wherein the mass addition portion is provided in a portion including an outer peripheral edge of the plate-shaped vibrating body.

7. The ultrasonic motor according to claim 1, wherein the plate-shaped vibrating body has a disk shape.

8. The ultrasonic motor according to claim 7, wherein the vibration mode is represented by an (M, N) mode, where M is a natural number and is a number of nodal lines extending in the circumferential direction of the plate-shaped vibrating body, and N is an integer greater than or equal to 0 and is a number of nodal lines extending in a radial direction of the plate-shaped vibrating body.

9. The ultrasonic motor according to claim 1, wherein the rotor has a rotor body and a rotation shaft that extends in the axial direction and through a through-hole of the rotor body.

10. The ultrasonic motor according to claim 1, wherein the piezoelectric element comprises a plurality of piezoelectric elements that are dispersedly disposed along the circumferential direction of the traveling wave.

11. The ultrasonic motor according to claim 10, wherein the plurality of piezoelectric elements each have a rectangular shape in a plan view.

12. The ultrasonic motor according to claim 1, wherein the mass addition portion is an annular protrusion.

13. The ultrasonic motor according to claim 12, wherein the annular protrusion extends in the axial direction.

14. The ultrasonic motor according to claim 1, wherein the piezoelectric element has a first electrode on a first surface and a second electrode on an opposing second surface of the piezoelectric element.

15. The ultrasonic motor according to claim 14, wherein the first electrode is attached to the first main surface of the plate-shaped vibrating body with an adhesive.

16. The ultrasonic motor according to claim 1, wherein the mass addition portion is on the second main surface of the plate-shaped vibrating body facing upward away from the piezoelectric element.

17. The ultrasonic motor according to claim 1, wherein the mass addition portion is disposed on both the first main surface and the second main surface of the plate-shaped vibrating body.

18. The ultrasonic motor according to claim 1, further comprising a plurality of protrusions on the second main surface of the plate-shaped vibrating body that extend in the axial direction from the second main surface.

19. The ultrasonic motor according to claim 18, wherein the plurality of protrusions are arranged in an annular shape as viewed from the axial direction and are located radially inside the nodal line when the traveling wave is excited.

20. The ultrasonic motor according to claim 9, further comprising a friction member attached to the rotor body, such that the rotor is in indirect contact with the second main surface of the plate-shaped vibrating body with the friction member interposed therebetween.

* * * * *